(12) United States Patent
Lee et al.

(10) Patent No.: US 10,872,875 B2
(45) Date of Patent: Dec. 22, 2020

(54) BONDING HEAD AND METHOD FOR BONDING SEMICONDUCTOR PACKAGE, AND SEMICONDUCTOR PACKAGE

(71) Applicant: SAMSUNG ELECTRONICS CO., LTD., Suwon-si (KR)

(72) Inventors: Sanghoon Lee, Seoul (KR); Jiwon Shin, Sejong-si (KR); Hyunggil Baek, Suwon-si (KR); Minkeun Kwak, Asan-si (KR); Jongho Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/281,496

(22) Filed: Feb. 21, 2019

(65) Prior Publication Data
US 2020/0027855 A1     Jan. 23, 2020

(30) Foreign Application Priority Data
Jul. 17, 2018    (KR) .......................... 10-2018-0082679

(51) Int. Cl.
    *H01L 23/48*      (2006.01)
    *H01L 23/52*      (2006.01)
    *H01L 23/00*      (2006.01)

(52) U.S. Cl.
CPC .............. *H01L 24/75* (2013.01); *H01L 24/32* (2013.01); *H01L 24/73* (2013.01); *H01L 24/83* (2013.01); *H01L 2224/32058* (2013.01); *H01L 2224/32225* (2013.01); *H01L 2224/73204* (2013.01); *H01L 2224/7531* (2013.01); *H01L 2224/83203* (2013.01)

(58) Field of Classification Search
CPC ......... H01L 24/32; H01L 24/73; H01L 24/45; H01L 24/85; H01L 24/05; H01L 24/97; H01L 24/82; H01L 24/75; H01L 24/08; H01L 24/78; H01L 24/84
USPC .......................................................... 257/783
See application file for complete search history.

(56) References Cited

U.S. PATENT DOCUMENTS

| | | |
|---|---|---|
| 5,111,989 A | 5/1992 | Holdgrafer et al. |
| 7,650,691 B2 | 1/2010 | Narita et al. |
| | (Continued) | |

FOREIGN PATENT DOCUMENTS

| | | |
|---|---|---|
| JP | 11-067833 | 3/1999 |
| JP | 2004-165391 A | 6/2004 |
| | (Continued) | |

*Primary Examiner* — Theresa T Doan
(74) *Attorney, Agent, or Firm* — Lee IP Law, P.C.

(57) ABSTRACT

A method for bonding a semiconductor package includes loading a semiconductor chip on a substrate, and bonding the semiconductor chip to the substrate by using a bonding tool, the bonding tool including a pressing surface for pressing the semiconductor chip, and an inclined surface extending from one side of the pressing surface. Bonding the semiconductor chip to the substrate includes deforming a bonding agent disposed between the substrate and the semiconductor chip by pressing the bonding tool, and deforming the bonding agent includes generating a fillet by protruding a portion of the bonding agent beyond the semiconductor chip, and growing the fillet in such a way that a top surface of the fillet is grown in an extending direction of the inclined surface.

19 Claims, 12 Drawing Sheets

(56) References Cited

U.S. PATENT DOCUMENTS

| | | |
|---|---|---|
| 8,720,519 B2 | 5/2014 | Yamakami et al. |
| 2005/0140023 A1* | 6/2005 | Kinoshita ............... H01L 24/29 |
| | | 257/778 |
| 2008/0188058 A1* | 8/2008 | Nishimura .............. H01L 24/27 |
| | | 438/455 |

FOREIGN PATENT DOCUMENTS

| | | |
|---|---|---|
| JP | 4229888 B2 | 2/2009 |
| JP | 6307729 B1 | 4/2018 |
| KR | 10-1228572 B1 | 1/2013 |

* cited by examiner

BONDING HEAD AND METHOD FOR BONDING SEMICONDUCTOR PACKAGE, AND SEMICONDUCTOR PACKAGE

CROSS-REFERENCE TO RELATED APPLICATION

Korean Patent Application No. 10-2018-0082679, filed on Jul. 17, 2018, in the Korean Intellectual Property Office, and entitled: "Head and Method for Bonding Semiconductor Package, and Semiconductor Package," is incorporated by reference herein in its entirety.

BACKGROUND

1. Field

Embodiments relate to a bonding head and a method for bonding a semiconductor package and, more particularly, to a bonding head capable of growing a fillet along an inclined surface of a bonding tool, a method for bonding a semiconductor package using the same, and a semiconductor package manufactured by the method.

2. Description of the Related Art

High-performance, high-speed and small electronic components have been increasingly demanded with the development of the electronic industry. To satisfy these demands, a plurality of semiconductor chips may be stacked on one substrate and/or a package may be stacked on another package.

These semiconductor mounting techniques may require a process of bonding electrical connection terminals between the substrate and the semiconductor chip or between the stacked semiconductor chips and/or packages. Bonding processes may include a reflow bonding process and a thermo-compression process.

SUMMARY

In an aspect, a method for bonding a semiconductor package may include loading a semiconductor chip on a substrate, and bonding the semiconductor chip to the substrate by using a bonding tool. The bonding tool may include a pressing surface for pressing the semiconductor chip, and an inclined surface extending from one side of the pressing surface. The bonding of the semiconductor chip to the substrate may include deforming a bonding agent disposed between the substrate and the semiconductor chip by pressing of the bonding tool. The deforming of the bonding agent may include generating a fillet by protruding a portion of the bonding agent beyond the semiconductor chip; and growing the fillet in such a way that a top surface of the fillet is grown in an extending direction of the inclined surface.

In an aspect, a bonding head for a semiconductor package may include a bonding tool for bonding a semiconductor package. The bonding tool may include a pressing surface for pressing a semiconductor chip, and an inclined surface for guiding a growing direction of a fillet.

In an aspect, a semiconductor package may include a substrate, a semiconductor chip, and a bonding agent between the substrate and the semiconductor chip. The bonding agent may include a bonding portion disposed between the substrate and the semiconductor chip, and a fillet protruding from the bonding portion outside the semiconductor chip. A top surface of the fillet may be inclined with respect to a chip top surface of the semiconductor chip.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
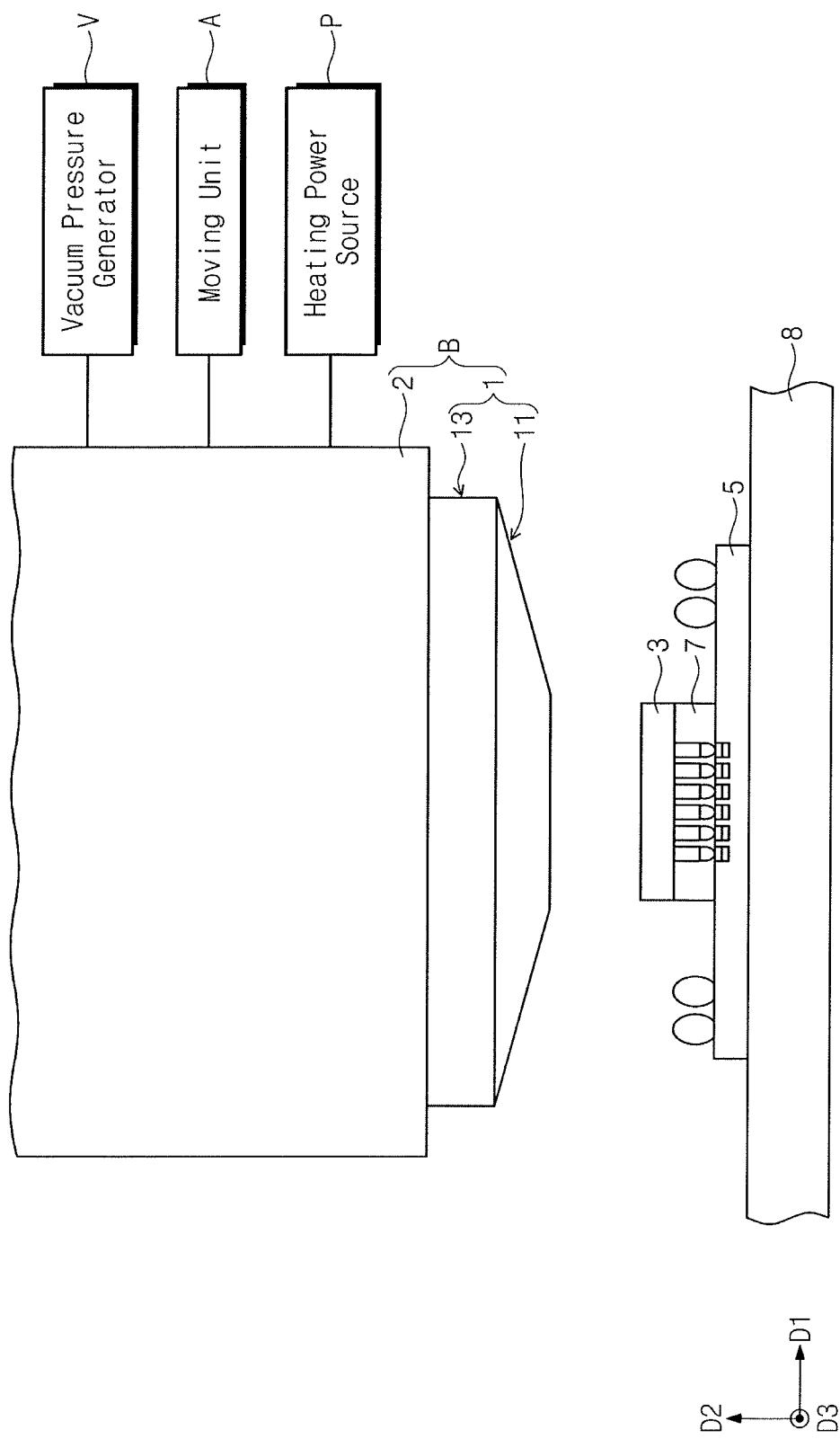
FIG. 1 illustrates schematic view of an apparatus for bonding a semiconductor package, according to some embodiments.

Hereinafter, embodiments will be described in detail with reference to the accompanying drawings. The same reference numerals or the same reference designators may denote the same elements throughout the specification.

Figure 2:
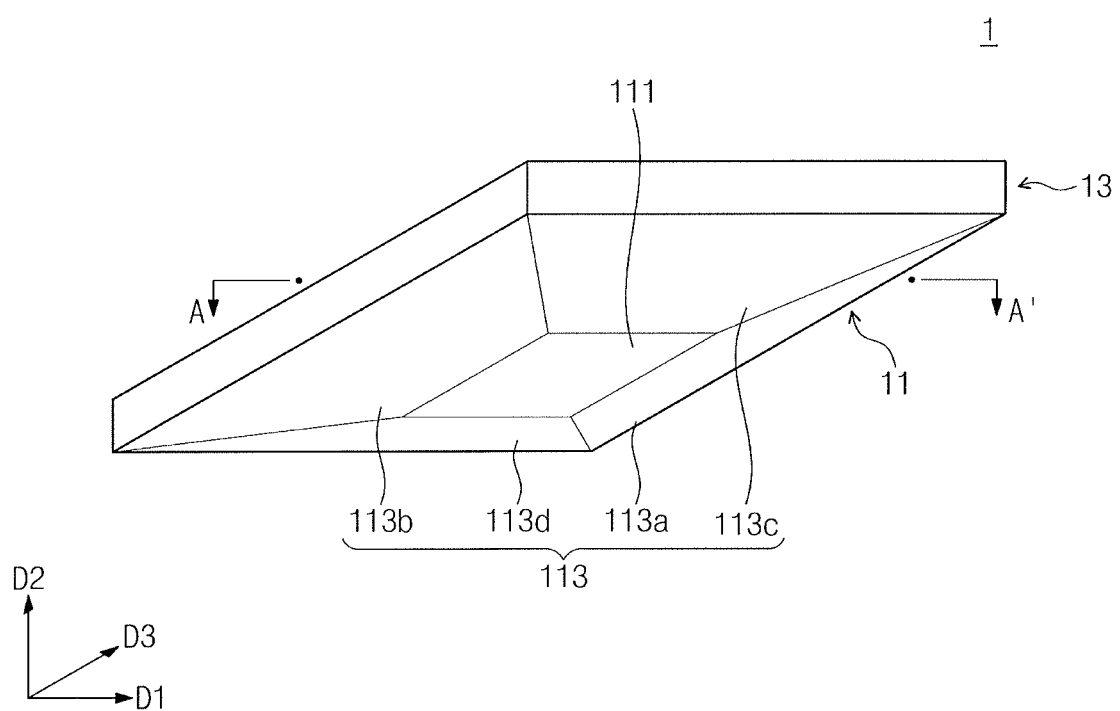
FIG. 2 illustrates a perspective view of a bonding head for a semiconductor package, according to some embodiments.
Figure 3:
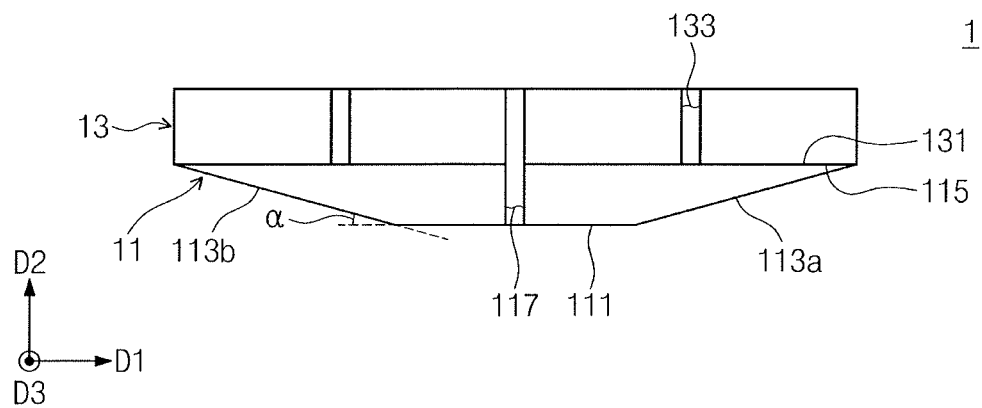
FIG. 3 illustrates a cross-sectional view along line A-A' of FIG. 2.

FIG. 1 is schematic view illustrating an apparatus for bonding a semiconductor package according to some embodiments, FIG. 2 is a perspective view illustrating a bonding head, and FIG. 3 is a cross-sectional view taken along line A-A' of FIG. 2.

In FIG. 1, a right direction is referred to as a first direction D1, and an upward direction is referred to as a second direction D2. In addition, a direction which is perpendicular to the first and second directions D1 and D2 and is oriented into the page is referred to as a third direction D3. Hereinafter, a direction including the first direction D1 and an opposite direction to the first direction D1 is referred to as a horizontal direction. The second direction D2 is referred to as an upward direction, and an opposite direction to the second direction D2 is referred to as a downward direction.

Referring to FIG. 1, a bonding apparatus B may be provided. The bonding apparatus B may bond a semiconductor chip 3 to a substrate 5 disposed on a bonding stage 8. The bonding apparatus B may perform a thermo-compression process of bonding the semiconductor chip 3 to the substrate 5. The thermo-compression process may bond the semiconductor chip 3 to the substrate 5 by heat and pressure. The thermo-compression process may be performed at a temperature lower than a process temperature of a reflow bonding process.

When a semiconductor package is bonded by the thermo-compression process, thermal stress occurring at the semiconductor package may be reduced. A defect (e.g., warpage) may be minimized or prevented by the reduction in thermal stress, and thus performance and functions of the semiconductor package may be maintained. When the semiconductor package is bonded by the thermo-compression process, bumps of a fine pitch may be easily aligned and bonded. Further, since bumps of a fine pitch are used, a size of the semiconductor package may be reduced.

As illustrated in FIG. 1, the semiconductor chip 3 may be bonded to the substrate 5 via a bonding agent 7. A shape of the bonding agent 7 may be deformed by compression of the bonding apparatus B in the thermo-compression process.

The bonding apparatus B may include a bonding head 1 and a bonding body 2. The bonding head 1 may be coupled to the bonding body 2. The bonding head 1 may apply heat to the semiconductor chip 3 disposed on the substrate 5 and/or may directly or indirectly press the semiconductor chip 3. The bonding body 2 may move the bonding head 1, may supply heat to the bonding head 1, and/or may provide vacuum pressure to the bonding head 1. The bonding body 2 may extend vertically, e.g., along the upward and downward directions, by a certain length. The bonding body 2 may be connected to a vacuum pressure generator V, a moving unit A, and a heating power source P. The vacuum pressure generator V may provide substantial vacuum pressure to the bonding body 2 and the bonding head 1. The moving unit A may move the bonding apparatus B in the horizontal direction and/or may move the bonding apparatus B in the upward and downward directions to press the semiconductor chip 3. The heating power source P may supply energy to the bonding apparatus B to allow the bonding head 1 to apply heat to the semiconductor chip 3. In some embodiments, the energy of the heating power source P which is applied to the bonding apparatus B may be electric energy. In certain embodiments, the heating power source P may supply the energy to the bonding apparatus B by a heat transfer method. In certain embodiments, the bonding stage 8 may also apply heat to a component such as the substrate 5. These will be described later in more detail.

As illustrated in FIG. 1, in some embodiments, the bonding head 1 for a semiconductor package may include a bonding tool 11 and a supporter 13. The supporter 13 may connect between the bonding body 2 and the bonding tool 11.

Referring to FIGS. 2 and 3, the bonding tool 11 may apply heat to the semiconductor chip 3 and/or may directly or indirectly press the semiconductor chip 3. The bonding tool 11 may include a metal material. In an embodiment, the bonding tool 11 may include aluminum. However, embodiments are not limited thereto. The bonding tool 11 may include a pressing surface 111, an inclined surface 113, and a top surface 115 (see FIG. 3).

In detail, the pressing surface 111 may be located at a bottom of the bonding tool 11, i.e., a surface facing the semiconductor chip 3. The pressing surface 111 may extend in the horizontal direction. The pressing surface 111 may press the semiconductor chip 3. In some embodiments, the pressing surface 111 may be in contact with a chip top surface 31 (see FIG. 6) of the semiconductor chip 3 and may press the semiconductor chip 3. In certain embodiments, the pressing surface 111 may press the semiconductor chip 3 with a protective sheet 91 (see FIG. 14) interposed therebetween, as will be described in more detail below.

In some embodiments, the pressing surface 111 may have a shape corresponding to a shape of the chip top surface 31 of the semiconductor chip 3. For example, if the chip top surface 31 of the semiconductor chip 3 has a rectangular shape, the pressing surface 111 may have a rectangular shape. In certain embodiments, the pressing surface 111 may have a circular shape (see FIGS. 15 and 17). In certain embodiments, the pressing surface 111 may have one of other various shapes capable of pressing the semiconductor chip 3. In some embodiments, an area of the pressing surface 111 may be equal to or greater than an area of the chip top surface 31 of the semiconductor chip 3. In certain embodiments, the area of the pressing surface 111 may be less than the area of the chip top surface 31 of the semiconductor chip 3. The pressing surface 111 will be described later in more detail.

The inclined surface 113 may extend from a side of the pressing surface 111. The inclined surface 113 may make a certain angle α (see FIG. 3) with an extension of the pressing surface 111. For example, the angle α may be an oblique angle, e.g., the angle α may not be 0 degree and/or 90 degrees. For example, as illustrated in FIG. 3, the angle α may be an acute angle. The bonding tool 11 including the inclined surface 113 may have a tapered shape of which a cross-sectional area becomes progressively less toward its bottom. For example, a distance along the horizontal direction between opposite portions of the inclined surface 113 may increase as a distance along the upward direction from the pressing surface 111 increases, e.g., the bonding tool 11 may have a cross section of an inverted trapezoid.

In some embodiments, the inclined surface 113 may include multiple inclined surfaces, e.g., four inclined surfaces. For example, as illustrated in FIG. 2, the four inclined surfaces may be referred to as a first inclined surface 113a, a second inclined surface 113b, a third inclined surface 113c, and a fourth inclined surface 113d, respectively. Each of the four inclined surfaces 113a, 113b, 113c, and 113d may extend from a different side of the pressing surface 111. For example, if the pressing surface 111 is a quadrangle, each of the four inclined surfaces 113a, 113b, 113c, and 113d may extend from a different side of the quadrangular pressing surface 111. In another example, if the pressing surface 111 is a circle, the inclined surface 113 may be one curved surface 113' or 113" extending from a perimeter of the circular pressing surface 111 (see FIG. 15 or 17). In embodiments, the shape and the number of the inclined surface 113 may be variously modified under a condition that the bonding tool 11 has a tapered shape, e.g., decreasing width with increased distance from the supporter 13. The inclined surface 113 will be described later in more detail.

Referring to FIG. 3, the top surface 115 may be located at a top of the bonding tool 11. The top surface 115 may extend in the horizontal direction. The top surface 115 may be substantially parallel to the pressing surface 111. The top surface 115 may be in, e.g., direct, contact with the supporter 13. In some embodiments, a shape of the top surface 115 may be substantially the same or similar to a shape of an adsorption surface 131 of the supporter 13. Alternatively, in certain embodiments, the shape of the top surface 115 may be different from the shape of the adsorption surface 131. This will be described later in more detail with reference to FIGS. 15 and 17.

In some embodiments, the bonding tool 11 may further include an adsorption hole 117. The adsorption hole 117 may be a hole extending from the top surface 115 toward the pressing surface 111, e.g., through an entire thickness of the bonding tool 11. The adsorption hole 117 may extend in the upward/downward direction. An inside of the adsorption hole 117 may become a substantial vacuum state. When the adsorption hole 117 is maintained in the vacuum state, the semiconductor chip 3 may be adsorbed on the pressing surface 111. The bonding tool 11 may press the semiconductor chip 3 and may also transfer the semiconductor chip 3. In certain embodiments, the bonding tool 11 may not include the adsorption hole 117. In this case, the semiconductor chip 3 may be transferred by an additional transfer unit.

The supporter 13 may couple the bonding tool 11 to the bonding body 2 (see FIG. 1). The supporter 13 may include a metal material. In an embodiment, the supporter 13 may include aluminum. In an embodiment, the supporter 13 may have a rectangular parallelepiped shape. However, embodiments are not limited thereto. The supporter 13 may include the adsorption surface 131 and a through-hole 133. The adsorption surface 131 may be located at a bottom of the supporter 13, i.e., facing the top surface 115 of the bonding tool 11. The adsorption surface 131 may be in contact with the top surface 115 of the bonding tool 11. The through-hole 133 may be a hole extending from the adsorption surface 131 of the supporter 13 in the upward direction, e.g., through an entire thickness of the supporter 13.

The through-hole 133 may be provided in plurality. One of the through-holes 133 may be connected to the adsorption hole 117 of the bonding tool 11, e.g., the through-holes 133 and the adsorption hole 117 may be aligned and overlap each other to define a combined passage through the bonding head 1. The through-hole 133 and the adsorption hole 117 may be connected to the vacuum pressure generator V (see FIG. 1). The vacuum pressure generator V may make a substantial vacuum state in the through-hole 133 and the adsorption hole 117.

The supporter 13 may be coupled to the bonding tool 11. In some embodiments, the supporter 13 and the bonding tool 11 may be detachably coupled to each other. The through-holes 133 may be at a substantial vacuum state. When the through-holes 133 are maintained in the vacuum state, the top surface 115 of the bonding tool 11 may be adsorbed on the adsorption surface 131, e.g., the top surface 115 of the bonding tool 11 and the adsorption surface 131 may be coupled to each other only via adsorption. The bonding tool 11 may be fixed at a certain position of the supporter 13. When the through-holes 133 are not in the vacuum state, the top surface 115 of the bonding tool 11 may be detached from the adsorption surface 131. In other words, the coupling of the supporter 13 and the bonding tool 11 may be released. Various bonding tools 11 may be used with one supporter 13 in accordance with a size and a shape of a semiconductor chip to be bonded. In certain embodiments, the supporter 13 and the bonding tool 11 may be integrally formed with each other as a single unitary body. The bonding tool 11 may not be detached from the supporter 13.

The supporter 13 may be heated. For example, referring to FIG. 1, the bonding body 2 may be supplied with the energy from the heating power source P to heat the supporter 13. The bonding body 2 may further include a heating member. The heating member may include a conductor having a resistance. When the electric energy is applied from the heating power source P to the heating member, Joule's heat may be generated from the heating member. Thus, a temperature of the bonding body 2 may rise, thereby transferring heat to the supporter 13 from the bonding body 2 with the high temperature. The heat of the supporter 13 may be transferred to the bonding tool 11. In certain embodiments, the bonding body 2 may not include the heating member. In this case, the supporter 13 may include a heating member. The heating member may include a conductor having a resistance. When the electric energy is applied from the heating power source P to the heating member, Joule's heat may be generated from the heating member. Thus, a temperature of the supporter 13 may rise. Heat may be transferred to the bonding tool 11 from the supporter 13 with the high temperature. This will be described later in more detail.

Figure 4:
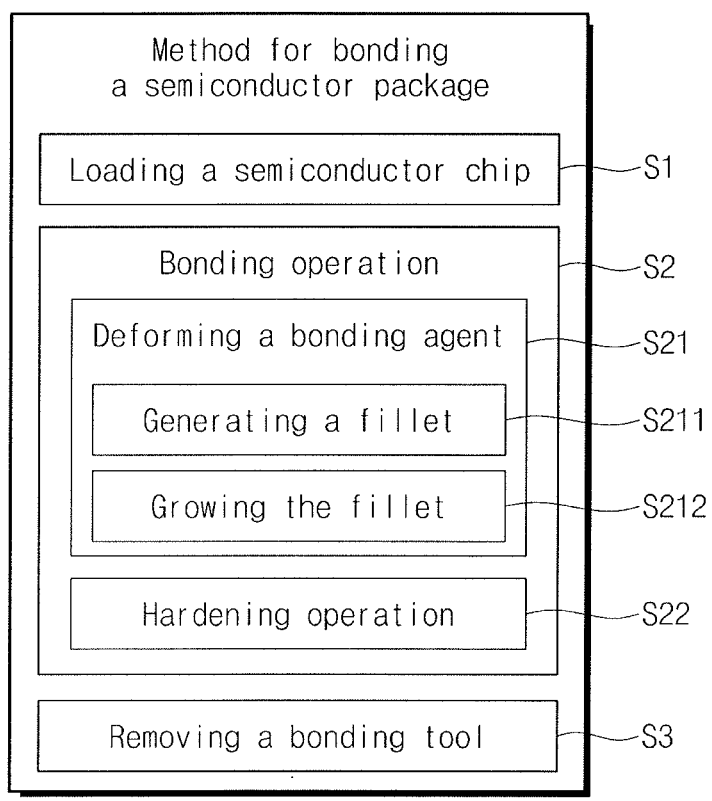
FIG. 4 illustrates a flowchart of a method for bonding a semiconductor package, according to some embodiments.

FIG. 4 is a flowchart illustrating a method for bonding a semiconductor package, according to some embodiments. FIGS. 5 to 13 are cross-sectional views illustrating stages in the method for bonding a semiconductor package.

Referring to FIG. 4, a method for bonding a semiconductor package according to some embodiments may include loading a semiconductor chip (S1), bonding the semiconductor chip (S2), and removing a bonding tool (S3).

Figure 5:
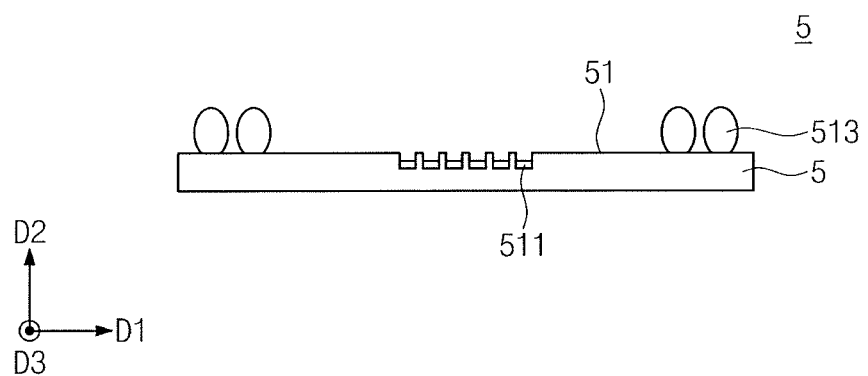
FIG. 5 illustrates a cross-sectional view of a substrate.

Referring to FIGS. 4 and 5, the substrate 5 may be provided. For example, the substrate 5 may include a printed circuit board (PCB) or a wafer. The substrate 5 may include a connection pad 511 and a bump 513 on a top surface 51 of the substrate 5. For example, the connection pad 511 may be disposed at a central portion of the top surface 51 of the substrate 5. However, embodiments are not limited thereto, e.g., the connection pad 511 may be disposed at a non-central position. The connection pad 511 may be provided in plurality.

The connection pads 511 may be electrically connected to the semiconductor chip 3 in a subsequent process. The connection pads 511 may include a conductor. For example, the connection pads 511 may include solder or copper.

In some embodiments, the connection pads 511 may be formed in regions recessed downward from the top surface 51 of the substrate 5. In certain embodiments, the connection pads 511 may be formed on substantially the same plane as the top surface 51 of the substrate 5. In certain embodiments, the connection pads 511 may protrude upward from the top surface 51 of the substrate 5.

In some embodiments, the bump 513 may be disposed on an edge of the top surface 51 of the substrate 5. The bump 513 may be provided in plurality. Each of the bumps 513 may electrically connect the substrate 5 to another component. The substrate 5 may be electrically connected to, e.g., another substrate, another semiconductor chip, or another package through the bumps 513. The bumps 513 may include a conductor. For example, the bumps 513 may include solder or copper.

Figure 6:
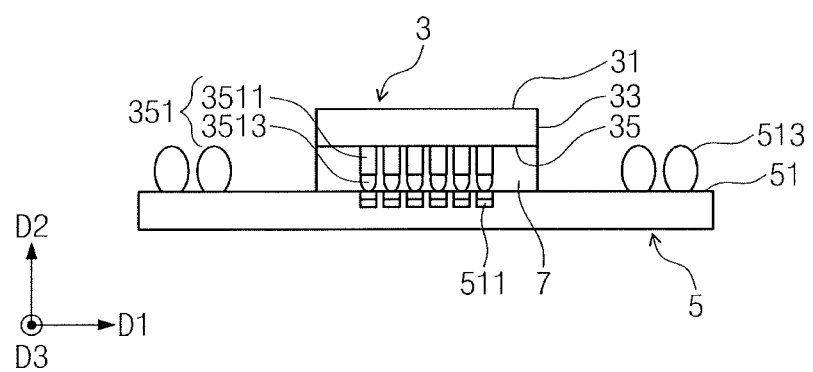
FIG. 6 illustrates a cross-sectional view of an operation of loading a semiconductor chip in FIG. 4.

Referring to FIGS. 4 and 6, the semiconductor chip 3 may be positioned on the substrate 5 in a flip chip manner during loading of the semiconductor chip (operation S1). The semiconductor chip 3 may include the chip top surface 31, a chip sidewall 33, and a chip bottom surface 35. In some embodiments, the chip top surface 31 and the chip bottom surface 35 may have rectangular shapes. However, embodiments are not limited thereto. The chip top surface 31 and the chip bottom surface 35 may have other shapes. The chip sidewall 33 may link or join the chip top surface 31 and the chip bottom surface 35.

The chip bottom surface 35 may have a chip bump 351. The chip bump 351 may extend from the chip bottom surface 35 in the downward direction by a certain length. The chip bump 351 may be provided in plurality. The chip bumps 351 may correspond to the connection pads 511 of the substrate 5, respectively. The number of the chip bumps 351 may be equal to the number of the connection pads 511. The chip bumps 351 may electrically connect the semiconductor chip 3 to the substrate 5. The chip bumps 351 may include a conductor.

In some embodiments, each of the chip bumps 351 may include a pillar 3511 extending downward from the chip bottom surface 35 and a cap 3513 coupled to a bottom of the pillar 3511. The pillar 3511 may include copper. In other words, the pillar 3511 may be a copper pillar bump. The cap 3513 may include solder. In other words, the cap 3513 may be a solder cap. In certain embodiments, each of the chip bumps 351 may be formed of only solder.

In some embodiments, the semiconductor chip 3 may be adsorbed to the bonding tool 11 by the adsorption hole 117 and then may be moved onto the substrate 5. The semiconductor chip 3 may be moved onto the substrate 5 in a state in which the semiconductor chip 3 is in contact with the pressing surface 111. Alternatively, the semiconductor chip 3 may be moved onto the substrate 5 in a state in which the semiconductor chip 3 is adsorbed to the bonding tool 11 via the protective sheet 91 (see FIG. 14). In certain embodiments, the semiconductor chip 3 may be moved onto the substrate 5 by an additional transfer unit. When the semiconductor chip 3 is disposed at an appropriate position over the substrate 5, the chip bumps 351 may be aligned with the connection pads 511, respectively.

The bonding agent 7 may be disposed between the semiconductor chip 3 and the substrate 5. The bonding agent 7 may include at least one of a non-conductive film (NCF), non-conductive paste (NCP), an anisotropic conductive film, anisotropic conductive paste, or a thermosetting adhesive.

In some embodiments, the semiconductor chip 3 may be moved onto the substrate 5 in a state in which the bonding agent 7 is provided on the chip bottom surface 35. When the bonding agent 7 is moved in the state in which it is provided on the chip bottom surface 35 of the semiconductor chip 3, the bonding agent 7 may be in a solid state.

In certain embodiments, the semiconductor chip 3 may be moved onto the substrate 5 on which the bonding agent 7 is provided or coated. In other words, the bonding agent 7 may be provided or coated directly on the substrate 5. The bonding agent 7 may be in a solid state or may be in a liquid or paste state.

Figure 7:
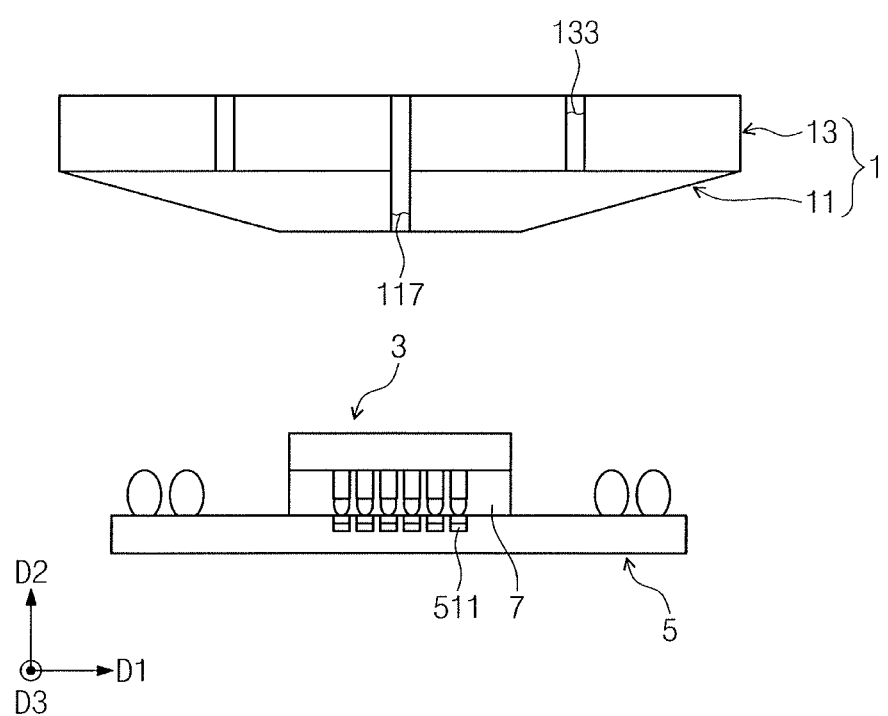
FIGS. 7 and 8 illustrate cross-sectional views of a bonding operation in FIG. 4.
Figure 8:
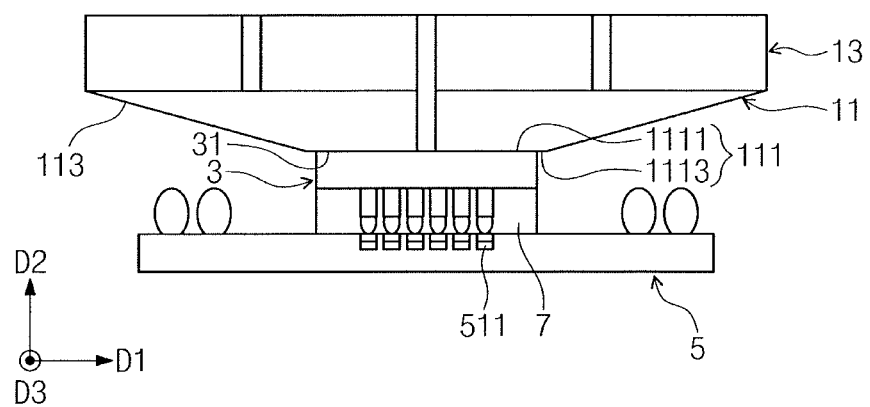

Referring to FIGS. 4 to 8, the bonding operation S2 may be performed by the bonding head 1. Referring to FIG. 7, in some embodiments, the bonding head 1 may be loaded to bond the semiconductor chip 3 to the substrate 5. Referring to FIG. 8, the bonding head 1 may move in the downward direction. Thus, the pressing surface 111 may come in contact with the chip top surface 31 of the semiconductor chip 3. In some embodiments, when the semiconductor chip 3 is moved in the state in which it is adsorbed to the bonding tool 11 by the adsorption hole 117, the pressing surface 111 may be already in contact with the chip top surface 31 at the beginning of the bonding operation S2.

Figure 9:
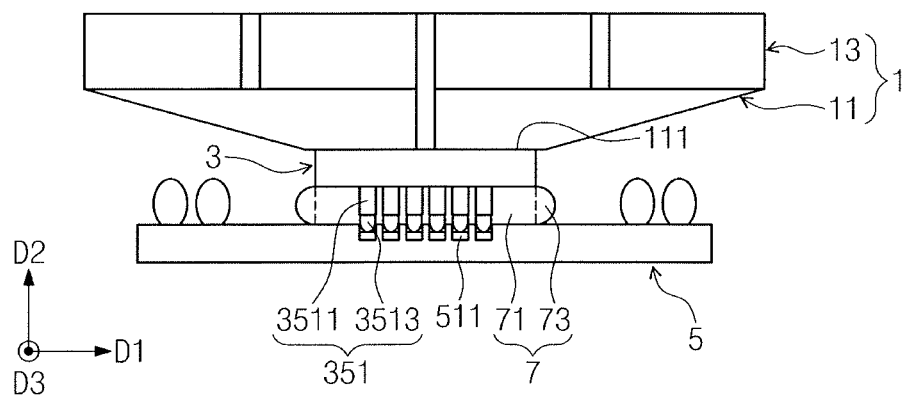
FIG. 9 illustrates a cross-sectional view of generating a fillet in FIG. 4.

Referring to FIGS. 4 and 9, the bonding operation S2 may include an operation S21 of deforming the bonding agent 7 and a hardening operation S22. The bonding head 1 may continuously move in the downward direction in operation S21 of deforming the bonding agent 7. In some embodiments, the area of the pressing surface 111 may be greater than the area of the chip top surface 31. In this case, the pressing surface 111 may include a corresponding surface 1111, i.e., a portion corresponding to (e.g., in direct contact with) the chip top surface 31, and an extending surface 1113, i.e., a portion extending from the corresponding surface 1111 but not facing (e.g., not in direct contact with) the chip top surface 31. In certain embodiments, the area of the pressing surface 111 may be equal to the area of the chip top surface 31, i.e., so the extending surface 1113 may be omitted. The operation S21 of deforming the bonding agent 7 may include generating a fillet (S211) and growing the fillet (S212).

The pressing surface 111 may press the chip top surface 31 of the semiconductor chip 3 in operation S211 of generating the fillet. The semiconductor chip 3 may be moved in the downward direction by the bonding tool 11. The chip bottom surface 35 of the semiconductor chip 3 may press the bonding agent 7 and the pillars 3511 I the downward direction. The pillars 3511 may press the caps 3513, respectively. In some embodiments, the caps 3513 may be partially inserted in the recessed regions of the substrate top surface 51, in which the connection pads 511 are formed. In certain embodiments, the caps 3513 may come in contact with the connection pads 511 formed on the substrate top surface 51 and then may be compressed.

In operation S211 of generating the fillet, the bonding tool 11 may be heated by the energy supplied from the heating power source P (see FIG. 1). The bonding tool 11 may transfer heat to the semiconductor chip 3. The semiconductor chip 3 may heat the bonding agent 7, the pillars 3511, and the caps 3513.

In some embodiments, when the bonding agent 7 is in the solid state, the state of the bonding agent 7 may be changed into a liquid or paste state by the heat. In certain embodiments, the bonding agent 7 may be already in the liquid or paste state. The bonding agent 7 may be pressed. Due to the pressure on the bonding agent 7 from the bonding tool 11, a portion of the bonding agent 7 may protrude from the chip bottom surface 35 of the semiconductor chip 3 beyond or outside the semiconductor chip 3. In more detail, a portion of the bonding agent 7 may protrude beyond the chip bottom surface 35 in the horizontal direction with respect to the semiconductor chip 3. In other words, the portion of the bonding agent 7 may laterally protrude from between the chip bottom surface 35 and the substrate 5. A portion of the bonding agent 7 disposed, e.g., directly, under the semiconductor chip 3 (i.e., a portion overlapped by the semiconductor chip 3 between the dashed lines in FIG. 9) may be referred to as a bonding portion 71, and the protruding portion of the bonding agent 7 (i.e., the portions not overlapped by the semiconductor chip 3) may be referred to as a fillet 73. The fillet 73 protruding from under the chip bottom surface 35 in the first direction D1 may be convex in the first direction D1. The fillet 73 protruding from under the chip bottom surface 35 in the opposite direction to the first direction D1 may be convex in the opposite direction to the first direction D1. For example, the fillet 73 may surround, e.g., an entire perimeter of, the semiconductor chip 3.

Figure 10:
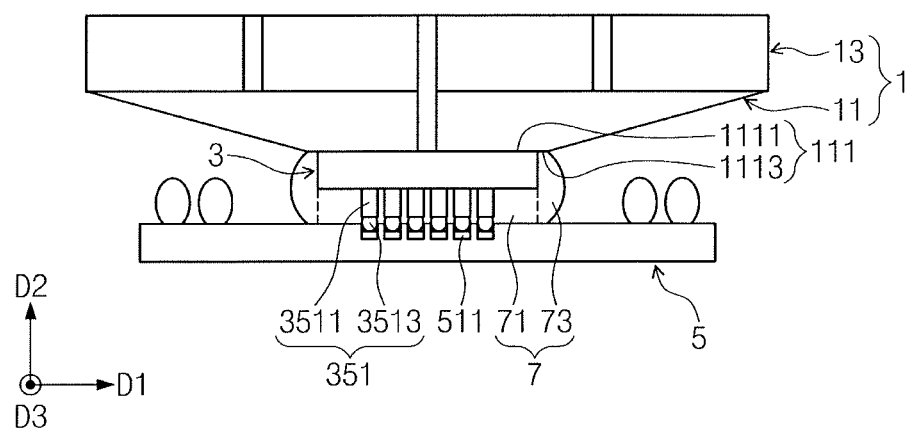
FIGS. 10 and 11 illustrate cross-sectional views of growing a fillet in FIG. 4.

Referring to FIGS. 4 and 10, the bonding head 1 may further move in the downward direction in operation S212 of growing the fillet 73. Thus, the pressing surface 111 may further press the semiconductor chip 3. The chip bottom surface 35 of the semiconductor chip 3 may further press the pillars 3511 and the bonding agent 7. The caps 3513 and the connection pads 511 may be compressed. The pillars 3511, the caps 3513 and the bonding agent 7 may be further heated. A temperature of the caps 3513 may be lower than a melting point of solder. Thus, if pressure is not applied, the caps 3513 and the connection pads 511 may not be melted. However, according to the embodiments, the bonding tool 11 may press the caps 3513 and the connection pads 511, and thus the caps 3513 and the connection pads 511 may be partially melted at the temperature lower than the melting point. The caps 3513 may be bonded to the connection pads 511.

The chip bottom surface 35 of the semiconductor chip 3 may further press the bonding agent 7, and thus a portion of the bonding portion 71 may be further moved beyond or outside the semiconductor chip 3. Thus, the fillet 73 may be grown or enlarged. The fillet 73 may be grown in the upward direction.

In some embodiments, the fillet 73 may be grown in the upward direction and then may reach the extending surface 1113. When the fillet 73 reaches the extending surface 1113, the growth of the fillet 73 in the upward direction may be stopped. Thereafter, the fillet 73 may be grown in the horizontal direction. The fillet 73 grown in the horizontal direction after reaching the extending surface 1113 may be grown to the inclined surface 113. In certain embodiments, when the extending surface 1113 does not exist, the fillet 73 may be grown in the upward direction to the inclined surface 113.

Figure 11:
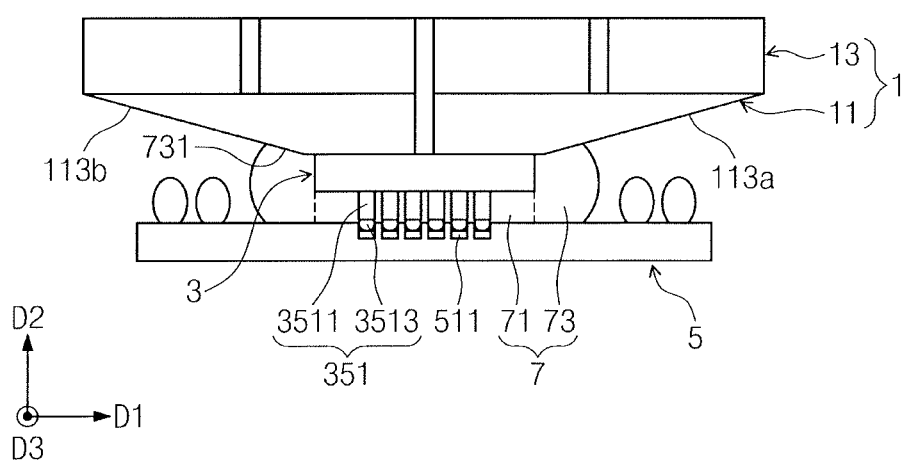

Referring to FIG. 11, the pressing surface 111 may further press the semiconductor chip 3. Thus, the chip bottom surface 35 of the semiconductor chip 3 may further press the pillars 3511 and the bonding agent 7. The pillars 3511 may further press the caps 3513, respectively. The caps 3513 and the connection pads 511 may be further compressed. The caps 3513 may be further bonded to the connection pads 511, respectively.

When the chip bottom surface 35 of the semiconductor chip 3 continuously presses the bonding agent 7, a fillet top surface 731 of the fillet 73 may be grown along an extending direction of the inclined surface 113. The inclined surface 113 may guide a growing direction of the fillet top surface 731. When the extending direction of the inclined surface 113 makes a certain angle α (see FIG. 3) with an extending direction of the pressing surface 111, an extending direction of the fillet top surface 731 may make the certain angle α with the chip top surface 31.

The fillet top surface 731 may be grown in the extending direction of the inclined surface 113, and thus the fillet 73 may be further grown in the upward direction as well as the horizontal direction. Thus, a length of the fillet 73 in the horizontal direction may be relatively reduced. In some embodiments, the fillet top surface 731 may be in contact with the inclined surface 113 and may be grown along the inclined surface 113. In certain embodiments, the fillet top surface 731 may be in contact with the protective sheet 91 (see FIG. 14) and may be grown in the extending direction of the inclined surface 113. This will be described later in more detail with reference to FIG. 14.

Referring to FIGS. 4 and 11, when a shape of the bonding agent 7 is deformed into a desired shape or the caps 3513 are sufficiently bonded to the connection pads 511, respectively, operation S212 of growing the fillet 73 may be finished. When operation S212 of growing the fillet 73 is finished, the hardening operation S22 may be started. The bonding agent 7 having the deformed shape may be hardened in the hardening operation S22. The hardened bonding agent 7 may be in a solid state or a state close to a solid. The caps 3513 and the connection pads 511 may be fixed in a state in which the caps 3513 are electrically connected to the connection pads 511, respectively. In some embodiments, heat may be further applied to the semiconductor chip 3 or the bonding agent 7 in the hardening operation S22. The bonding agent 7 may be hardened by the applied heat. However, embodiments are not limited thereto. The bonding agent 7 may be hardened by other method(s). The hardened bonding agent 7 may be in a solid state or a state close to a solid.

As described above, the operation of melting and bonding the caps 3513 and the connection pads 511 and the operation of deforming and hardening the bonding agent 7 may be performed at substantially the same time.

Figure 12:
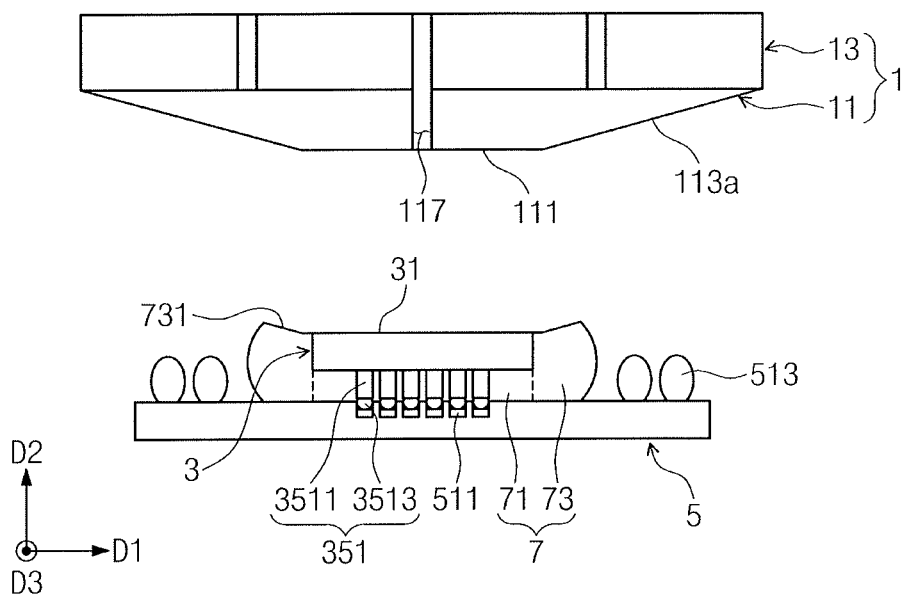
FIG. 12 illustrates a cross-sectional view of removing a bonding tool in FIG. 4.

Referring to FIGS. 4 and 12, after the hardening operation S22 is finished, operation S3 of removing the bonding tool 11 may be performed. The bonding head 1 including the bonding tool 11 may move in the upward direction in operation S3 of removing the bonding tool 11. The pressing surface 111 may be separated from the chip top surface 31. The inclined surface 113 may be separated from the fillet top surface 731.

If the extending direction of the pressing surface 111 were to be perpendicular to the extending direction of the inclined surface 113, i.e., if α were to equal 90 degrees, the fillet 73 would stick or adhere to the inclined surface 113 when the bonding tool 11 moved in the second direction D2. In this case, the fillet 73 would catch, e.g., stick to, the inclined surface 113, and thus the bonding tool 11 would be detached from the supporter 13. Alternatively, the fillet 73 would temporarily catch the inclined surface 113, and thus a coupling position of the bonding tool 11 and the supporter 13 would be changed. If the bonding tool 11 deviates from a set position, an error may occur in a subsequent bonding process. Thus, the bonding process may be delayed and total processes may be delayed. Accordingly, efficiency of processes may be reduced.

In contrast, according to embodiments, the extending direction of the pressing surface 111 may not be perpendicular to the extending direction of the inclined surface 113 ($\pi \neq 90$ degrees). Thus, when the bonding tool 11 moves in the second direction D2, the inclined surface 113 may be easily detached from the fillet top surface 731. In other words, it is possible to prevent the fillet 73 from adhering to the inclined surface 113. As a result, it is possible to prevent the bonding tool 11 from being detached from the supporter 13 by the fillet 73. In addition, it is possible to prevent the coupling position of the bonding tool 11 and the supporter 13 from being changed by the fillet 73. Thus, the bonding tool 11 may be fixed at the set position. As a result, a subsequent bonding process may be smoothly performed. The bonding process may be quickly performed and the total processes may be quickly performed. Accordingly, the efficiency of the processes may be improved.

In the embodiments, even though the bonding head 1 does not have a protective film, the bonding head 1 may prevent the inclined surface 113 from being coupled or adhered to the fillet top surface 731. As a result, the number of parts of the apparatus for the process may be reduced, and process costs may be reduced.

Figure 13:
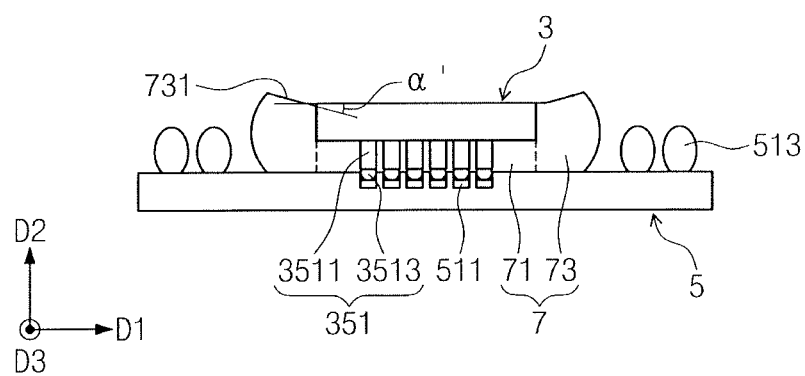
FIG. 13 illustrates a cross-sectional view of a shape of a semiconductor chip and a substrate which are bonded to each other by a bonding tool.

FIG. 13 is a cross-sectional view illustrating a substrate and a semiconductor chip bonded to each other by the method for bonding a semiconductor package according to some embodiments.

Referring to FIG. 13, the connection pads 511 of the substrate 5 may be electrically connected to the caps 3513 of the semiconductor chip 3, respectively. A current may flow between the substrate 5 and the semiconductor chip 3. Each connection pad 511 and each cap 3513 connected to each other may be supported and/or protected by the bonding agent 7.

The fillet top surface 731 may be inclined with respect to the chip top surface 31 of the semiconductor chip 3. In more detail, the fillet top surface 731 may make a certain angle α' with the chip top surface 31. The angle α' may not be 0 degree and/or 90 degrees. The angle α' may be substantially equal or similar to the angle α.

The bonding agent 7 including the fillet 73 may be grown upward as illustrated in FIG. 12. Thus, a length of the bonding agent 7 in the horizontal direction may be reduced. As a result, the bumps 513 on the substrate 5 may not be damaged by the bonding agent 7, and shapes and/or functions of the bumps 513 may be maintained. In addition, the bumps 513 may be disposed relatively close to the semiconductor chip 3, and thus a length of the substrate 5 in the horizontal direction may be reduced. In other words, a size of the substrate 5 may be reduced.

After the semiconductor chip 3 is bonded to the substrate 5, another semiconductor chip may be stacked on the semiconductor chip 3. Alternatively, another substrate or package may be stacked on the semiconductor chip 3. The other substrate or package may be electrically connected to the substrate 5 through the bumps 513 of the substrate 5. An empty space may be filled with a mold material to protect the bumps 513 and the semiconductor chip 3. Since the size of the substrate 5 is reduced, a size of a semiconductor package including the substrate 5 may also be reduced.

Figure 14:
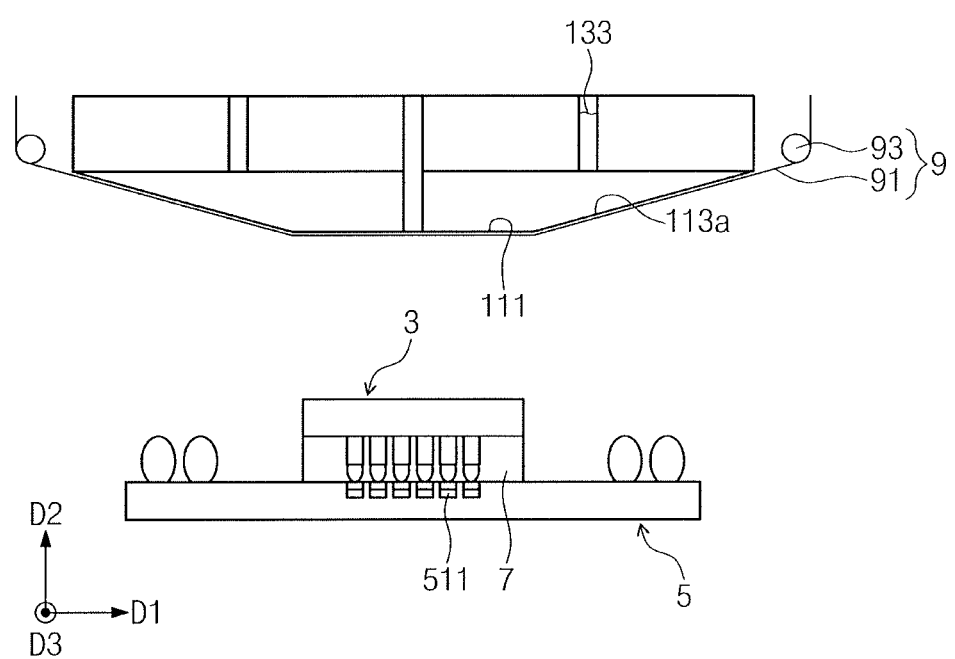
FIG. 14 illustrates a cross-sectional view of a bonding head for a semiconductor package, according to some embodiments.

FIG. 14 is a cross-sectional view illustrating a semiconductor chip, a substrate, and a bonding head for a semiconductor package, according to some embodiments.

Hereinafter, the descriptions to the same or similar elements and technical features as in the embodiments of FIGS. 1 to 13 will be omitted or mentioned briefly for the purpose of ease and convenience in explanation. In other words, differences between the present embodiments and the embodiments of FIGS. 1 to 13 will be mainly described hereinafter.

Referring to FIG. 14, a bonding head for a semiconductor package may further include a protective unit 9. The protective unit 9 may include a protective sheet 91 and a reel 93. The protective sheet 91 may cover a portion of the pressing surface 111 and/or the inclined surface 113. The protective sheet 91 may prevent the pressing surface 111 and/or the inclined surface 113 from being in, e.g., direct, contact with the bonding agent 7. The protective sheet 91 may protect the pressing surface 111 and/or the inclined surface 113 from contamination of the bonding agent 7. The protective sheet 91 may prevent the bonding agent 7 from adhering to the pressing surface 111 and/or the inclined surface 113. The pressing surface 111 may press the chip top surface 31 of the semiconductor chip 3 with the protective sheet 91 interposed therebetween. The inclined surface 113 may guide the growing direction of the fillet 73 with the protective sheet 91 interposed therebetween. The fillet top surface 731 may be grown along the protective sheet 91 in the extending direction of the inclined surface 113. The reel 93 may change a direction of the protective sheet 91 and/or may move the protective sheet 91. When one bonding process is finished, the protective sheet 91 may be replaced with a new one or a new portion.

Figure 15:
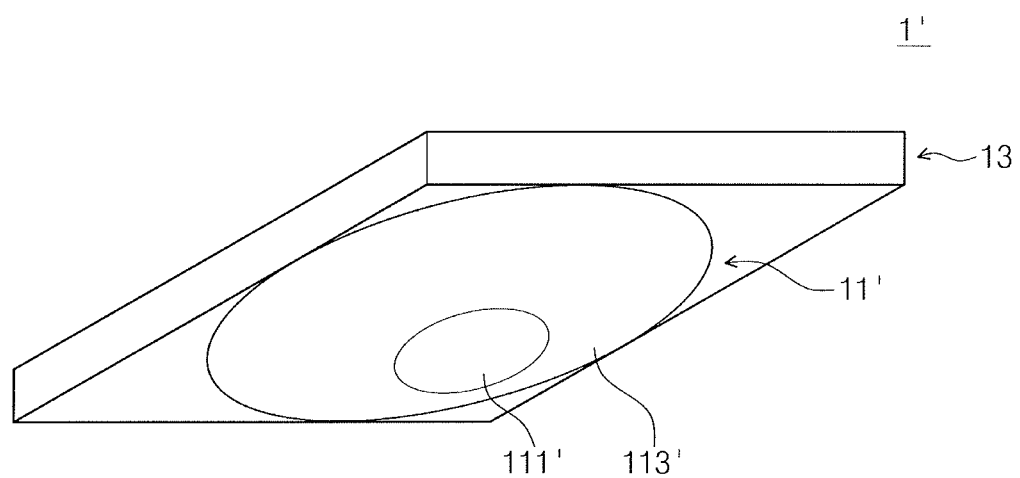
FIG. 15 illustrates a perspective view of a bonding head for a semiconductor package, according to some embodiments.
Figure 15:
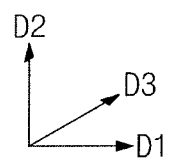

FIG. 15 is a perspective view illustrating a bonding head for a semiconductor package, according to some embodiments.

Hereinafter, the descriptions to the same or similar elements and technical features as in the embodiments of FIGS. 1 to 13 will be omitted or mentioned briefly for the purpose of ease and convenience in explanation. In other words, differences between the present embodiments and the embodiments of FIGS. 1 to 13 will be mainly described hereinafter.

Referring to FIG. 15, a bonding head 1' may include a bonding tool 11' and the supporter 13. The bonding tool 11' may include a pressing surface 111' and an inclined surface 113'. The pressing surface 111' may press the semiconductor chip 3. The pressing surface 111' may have a circular shape. An area of the pressing surface 111' may be equal to or greater than the area of the chip top surface 31 of the semiconductor chip 3. The inclined surface 113' may be a curved surface. A horizontal cross-sectional area of the inclined surface 113' may become progressively greater from the pressing surface 111' toward a top surface of the bonding tool 11'. The bonding tool 11' including the inclined surface 113' may have a tapered shape. The bonding tool 11' may have a truncated cone shape. The fillet may be grown along an extending direction of the inclined surface 113'.

Figure 16:
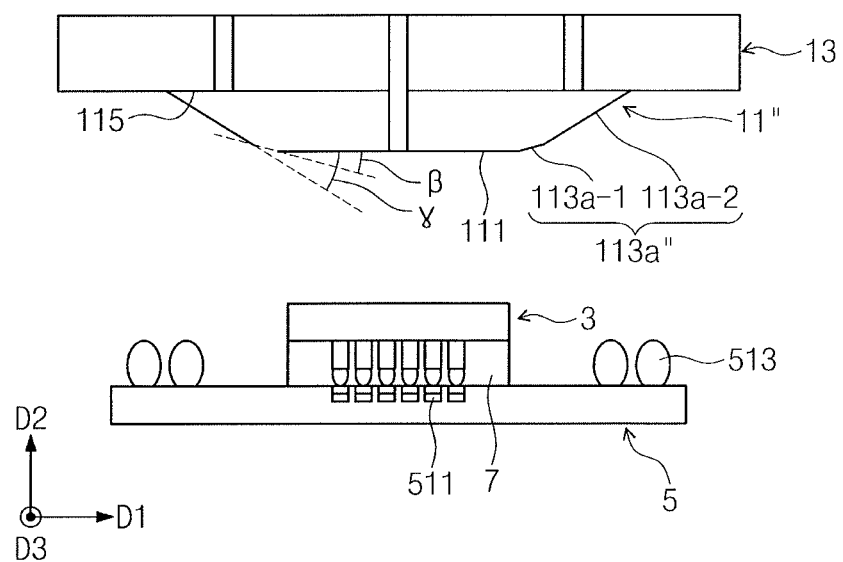
FIG. 16 illustrates a cross-sectional view of a bonding head for a semiconductor package, according to some embodiments.

FIG. 16 is a cross-sectional view illustrating a semiconductor chip, a substrate, and a bonding head for a semiconductor package, according to some embodiments.

Hereinafter, the descriptions to the same or similar elements and technical features as in the embodiments of FIGS. 1 to 13 will be omitted or mentioned briefly for the purpose of ease and convenience in explanation. In other words, differences between the present embodiments and the embodiments of FIGS. 1 to 13 will be mainly described hereinafter.

Referring to FIG. 16, a bonding tool 11" may include an inclined surface 113". Similarly to FIG. 2, the inclined surface 113" may include a first inclined surface 113a", the second inclined surface 113b, the third inclined surface 113c, and the fourth inclined surface 113d. The first inclined surface 113a" may include a plurality of surfaces having various angles, unlike FIG. 2. For example, the first inclined surface 113a" may include a first inclined surface section 113a-1 and a second inclined surface section 113a-2. The first inclined surface section 113a-1 may extend from one side of the pressing surface 111 in an upper-right direction. The extending direction of the first inclined surface section 113a-1 may make a certain angle $\beta$ with the extending direction of the pressing surface 111. For example, the angle $\beta$ may be less than the angle $\alpha$ (see FIG. 3). The second inclined surface section 113a-2 may link or join the first inclined surface section 113a-1 to the top surface 115. An extending direction of the second inclined surface section 113a-2 may make a certain angle $\gamma$ with the extending direction of the pressing surface 111. The angle $\gamma$ may be greater than the angle $\beta$. The angle $\gamma$ may be greater than the angle $\alpha$. For example, the first inclined surface 113a" may have more than two surface sections.

The bonding tool 11" may move in the downward direction, and thus the pressing surface 111 may press the semiconductor chip 3. The bonding agent 7 may laterally protrude beyond the semiconductor chip 3 to form the fillet. The fillet may be grown along the extending direction of the first inclined surface section 113a-1. The first inclined surface section 113a-1 may make the angle $\beta$ with the pressing surface 111, and the angle $\beta$ may be less than the angle $\alpha$. Thus, a growing direction of the fillet may be relatively inclined toward the horizontal direction. When the fillet top surface is grown and then meets the second inclined surface section 113a-2, the fillet top surface may be grown along the extending direction of the second inclined surface section 113a-2. The second inclined surface section 113a-2 may make the angle $\gamma$ with the pressing surface 111, and the angle $\gamma$ may be greater than the angle $\beta$. Thus, a growing direction of the fillet may be relatively inclined toward the upward direction. The fillet may be rapidly grown upward.

The amount of the bonding agent 7 adhering to the bonding tool 11" may decrease as the angle between the inclined surface and the pressing surface 111 decreases. The angle β between first inclined surface section 113*a*-1 and the pressing surface 111 may be less than the angle α. Thus, the bonding agent 7 may relatively less adhere to the bonding tool 11.

The fillet may be grown upward when the angle between the inclined surface 113' and the pressing surface 111' is great. The bumps 513 may be disposed on the edge of the top surface of the substrate 5. Thus, it may be necessary to prevent the fillet from being grown toward an edge of the substrate 5. The fillet may be grown toward the edge of the substrate 5 and then may be rapidly grown upward when meeting the second inclined surface section 113*a*-2. Thus, it is possible to prevent the fillet from being grown in the horizontal direction to be connected to the bump 513.

The adhesion of the bonding agent 7 to the bonding tool 11" and the growth of the bonding agent 7 in the first direction D1 may be prevented by the inclined surface including the plurality of surfaces having the various angles.

Each of the second, third and fourth inclined surfaces 113*b*, 113*c*, and 113*d* may include a plurality of surfaces having various angles, like the first inclined surface 113*a*". In certain embodiments, each of the first, second, third and fourth inclined surfaces 113*a*, 113*b*, 113*c*, and 113*d* may include three or more surfaces having different angles from each other. In this case, each inclined surface may be referred to as an x-n-th inclined surface 113*x*-*n*. Here, 'x' may be 'a', 'b', 'c', or 'd', and 'n' may be the number of the surfaces having different angles from each other. When 'n' increases infinitely, each of the inclined surfaces 113*a* to 113*d* may become a curved surface.

Figure 17:
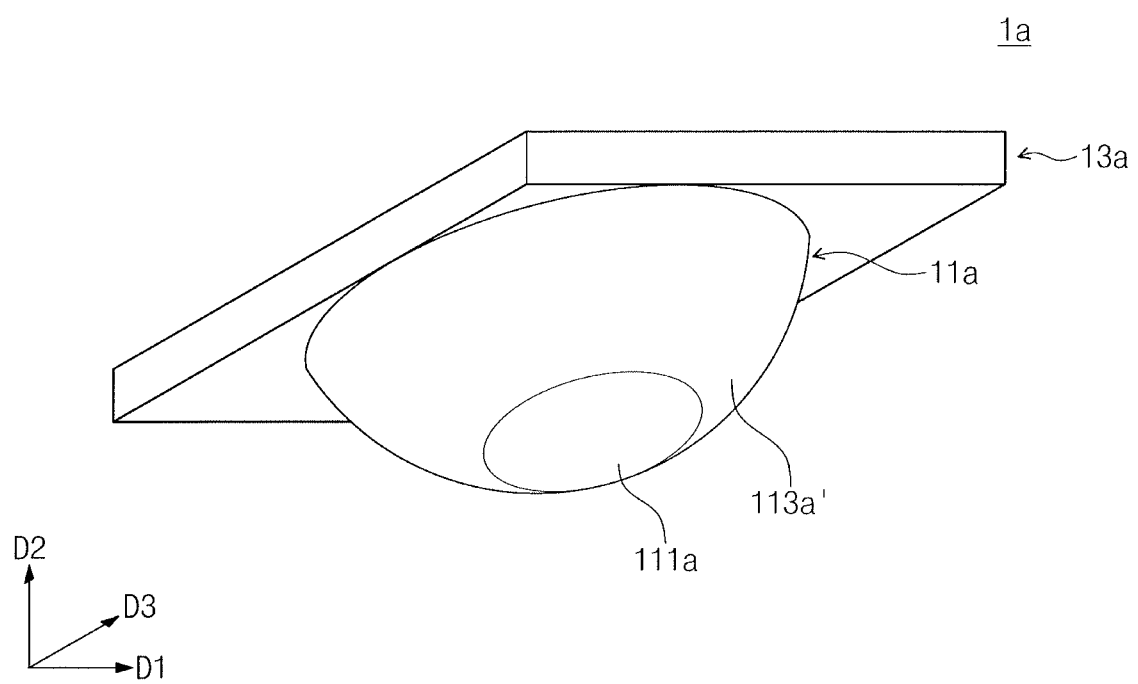
FIG. 17 illustrates a perspective view of a bonding head for a semiconductor package, according to some embodiments.

FIG. 17 is a perspective view illustrating a bonding head for a semiconductor package, according to some embodiments.

Hereinafter, the descriptions to the same or similar elements and technical features as in the embodiments of FIGS. 1 to 13 will be omitted or mentioned briefly for the purpose of ease and convenience in explanation. In other words, differences between the present embodiments and the embodiments of FIGS. 1 to 13 will be mainly described hereinafter.

Referring to FIG. 17, a bonding head 1*a* may include a bonding tool 11*a* and the supporter 13. The bonding tool 11*a* may include a pressing surface 111*a* and an inclined surface 113*a*'. The pressing surface 111*a* may press the semiconductor chip. The pressing surface 111*a* may have a circular shape. An area of the pressing surface 111*a* may be equal to or greater than the area of the chip top surface of the semiconductor chip. The inclined surface 113*a*' may be a curved surface. A horizontal cross-sectional area of the inclined surface 113*a*' may become progressively greater from the pressing surface 111*a* toward a top surface of the bonding tool 11*a*. The horizontal cross-sectional area may be a circular shape. The bonding tool 11*a* including the inclined surface 113*a*' may have a tapered shape. A shape of the bonding tool 11*a* may be substantially a half-sphere shape of which a bottom end portion is cut. The fillet may be grown along the inclined surface 113*a*'.

By way of summation and review, according to embodiments, an inclined surface may be formed in a bonding tool, so a growing direction of a fillet of a bonding agent may be guided along the inclined surface. Thus, a width of the fillet in a horizontal direction may be reduced, thereby prevent or substantially minimizing adhesion between the fillet and the bonding tool.

Therefore, according to the embodiments, the fillet may be grown vertically, e.g., along the upward and downward direction. According to the embodiments, the width or length of the bonding agent in the horizontal direction may be reduced to manufacture a small package. According to the embodiments, it is possible to prevent the fillet of the bonding agent from adhering to the bonding tool. According to the embodiments, continuous bonding processes may be easily performed.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method for bonding a semiconductor package, the method comprising:
   loading a semiconductor chip on a substrate; and
   bonding the semiconductor chip to the substrate by using a bonding tool, the bonding tool including:
      a pressing surface for pressing the semiconductor chip,
      a top surface spaced apart from the pressing surface, and
      an inclined surface extending from one side of the pressing surface to connect the pressing surface to the top surface,
   wherein bonding the semiconductor chip to the substrate includes deforming a bonding agent disposed between the substrate and the semiconductor chip by pressing the bonding tool, and
   wherein deforming the bonding agent includes generating a fillet by protruding a portion of the bonding agent beyond the semiconductor chip, and growing the fillet in such a way that a top surface of the fillet is grown in an extending direction of the inclined surface.

2. The method as claimed in claim 1, wherein the inclined surface is provided in plurality.

3. The method as claimed in claim 1, wherein bonding the semiconductor chip to the substrate further includes hardening the deformed bonding agent.

4. The method as claimed in claim 3, further comprising removing the bonding tool after hardening the deformed bonding agent.

5. The method as claimed in claim 3, wherein hardening the deformed bonding agent includes heating the deformed bonding agent by the bonding tool.

6. The method as claimed in claim 1, wherein an area of the pressing surface is equal to or greater than an area of a chip top surface of the semiconductor chip.

7. The method as claimed in claim 1, wherein the bonding agent includes at least one of a non-conductive film (NCF), non-conductive paste (NCP), an anisotropic conductive film, or anisotropic conductive paste.

8. A bonding head for a semiconductor package, the bonding head comprising:

a bonding tool to bond a semiconductor package, wherein the bonding tool includes:
- a pressing surface to press a semiconductor chip,
- a top surface spaced apart from the pressing surface, and
- an inclined surface connecting the pressing surface to the top surface, the inclined surface extending from the pressing surface to guide a growing direction of a fillet.

9. The bonding head as claimed in claim 8, further comprising a supporter coupled to the bonding tool.

10. The bonding head as claimed in claim 9, wherein the bonding tool and the supporter are detachably coupled to each other.

11. The bonding head as claimed in claim 10, wherein the supporter includes a through-hole.

12. The bonding head as claimed in claim 9, wherein the bonding tool and the supporter include a same material.

13. The bonding head as claimed in claim 8, wherein the inclined surface is provided in plurality.

14. The bonding head as claimed in claim 8, wherein the bonding tool includes an adsorption hole.

15. The bonding head as claimed in claim 8, further comprising a protective sheet protecting the pressing surface and the inclined surface.

16. The bonding head as claimed in claim 8, wherein a width of the top surface is larger than a width of the pressing surface along a horizontal direction parallel to the pressing surface.

17. The bonding head as claimed in claim 16, further comprising a supporter coupled to the top surface, a width of the supporter being larger than the width of the pressing surface along the horizontal direction parallel to the pressing surface.

18. The bonding head as claimed in claim 8, wherein an angle between the inclined surface and the pressing surface is a constant obtuse angle.

19. The bonding head as claimed in claim 8, wherein the bonding tool includes metal.

* * * * *